Figure 1:
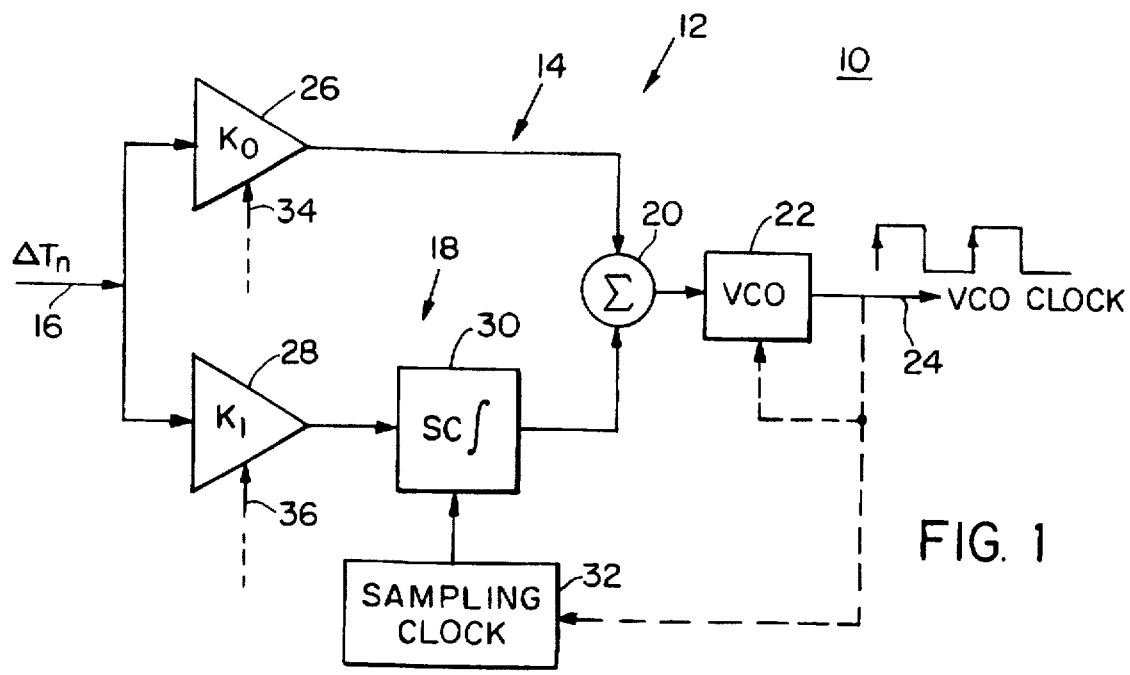

United States Patent [19]
Kovacs

[11] Patent Number: 5,787,134
[45] Date of Patent: *Jul. 28, 1998

[54] SWITCHED CAPACITANCE PHASE LOCKED LOOP SYSTEM

[75] Inventor: Janos Kovacs, North Andover, Mass.

[73] Assignee: Analog Devices, Inc., Norwood, Mass.

[*] Notice: The term of this patent shall not extend beyond the expiration date of Pat. No. 5,495,512.

[21] Appl. No.: 324,747

[22] Filed: Oct. 18, 1994

Related U.S. Application Data

[63] Continuation-in-part of Ser. No. 314,894, Sep. 29, 1994, Pat. No. 5,495,512, which is a continuation-in-part of Ser. No. 34,248, Sep. 12, 1994, Pat. No. 5,414,390.

[51] Int. Cl.$^6$ .................................................. H03D 3/24
[52] U.S. Cl. ........................ 375/376; 331/32; 331/365 C
[58] Field of Search ................................ 375/120, 371, 375/373, 375; 331/4, 32, 17, 1 R, 10, 14, 18, 25, 36 R, 36 C, 1 A, DIG. 2; 327/141, 155, 156, 159, 160, 162

[56] References Cited

U.S. PATENT DOCUMENTS

| | | | |
|---|---|---|---|
| 4,890,299 | 12/1989 | Dolivo et al. | 375/18 |
| 4,894,734 | 1/1990 | Fischler et al. | 360/51 |
| 4,929,918 | 5/1990 | Chung et al. | 331/10 |
| 5,036,294 | 7/1991 | McCarslin | 375/376 |
| 5,258,933 | 11/1993 | Johnson et al. | 364/602 |
| 5,384,551 | 1/1995 | Kennedy et al. | 375/376 |

OTHER PUBLICATIONS

Philport et al., "A 7mbyte/s (65 MHZ), Mixed–Signal, Magnetic Recording Channel DSP Using Partial, Response Signaling with Maximum Liklihood Detection", IEEE Journal, vol. 29, No. 3 Mar. 1994.

*Primary Examiner*—Wellington Chin
*Assistant Examiner*—William Luther
*Attorney, Agent, or Firm*—Iandiorio & Teska

[57] ABSTRACT

A switched capacitance phase locked loop (PLL) system includes a filter circuit having a scaling channel for scaling the phase error; an integrating channel for integrating the phase error; and a summing device for combining the scaled phase error and the integrated phase error; a voltage controlled oscillator (VCO) responsive to the summing device produces an output; the VCO's gain is proportional to its output clock frequency; the integrating channel includes a switched capacitance integrating circuit for controlling the gain of the integrating channel proportional to the output clock frequency of the VCO and maintaining constant the ratio of, and scaling the product of, the unity gain frequency and the zero frequency of the phase locked loop to keep constant the damping factor and to scale the natural frequency of the phase locked loop with the output clock frequency of the VCO, respectively.

8 Claims, 2 Drawing Sheets

SWITCHED CAPACITANCE PHASE LOCKED LOOP SYSTEM

RELATED CASE

This application is a continuation-in-part of a U.S. patent application filed Sep. 29, 1994, entitled "Hybrid Phase Locked Loop", by Kovacs et al. (Attorney Docket No. AD-148J corresponding to U.S. Ser. No. 08/314,894) now U.S. Pat. No. 5,495,512 which is a continuation-in-part of a U.S. patent application filed Sep. 12, 1994, entitled "Center Frequency Controlled Phase Locked Loop System", by Kovacs et al. (Attorney Docket No. AD-149J corresponding to U.S. Ser. No. 08/304,248) now U.S. Pat. No. 5,414,390.

FIELD OF INVENTION

This invention relates to a switched capacitance phase locked loop (PLL) system.

BACKGROUND OF INVENTION

Conventional second order feedback circuits such as phase locked loop (PLL) circuits may be analog, continuous time, types or digital, discrete time types. The analog, continuous time types (PLLs) use a phase detector to determine any shift in phase and energize a charge pump accordingly. The charge pump output representing the amount and polarity of the difference in phase is passed through a filter to provide a signal to operate a voltage controlled oscillator to adjust the frequency of a clock signal provided to the phase detector to realign the phase of the clock and input signal. These analog type of PLLs have the disadvantage that they do not scale well and their damping characteristics vary with variations in the operating frequency. Digital, discrete time PLLs do not have these disadvantages but have the disadvantage that their digital loop filters are costly, large and complex and require a good deal of power. In one recent approach described in the U.S. patent application filed Sep. 12, 1994, entitled "Center Frequency Controlled Phase Locked Loop System", by Kovacs et al. (Attorney Docket No. AD-149J), and U.S. patent application filed Sep. 29, 1994, entitled "Hybrid Phase Locked Loop", by Kovacs et al. (Attorney Docket No. AD-148J), and incorporated herein in their entirety by reference, a phase locked loop includes a filter circuit having a scaling channel for scaling the phase error, an integrating channel for integrating the phase error, and a summing device for combining the scaled phase error and the integrated phase error. A voltage controlled oscillator (VCO) responds to the summing device to produce an output such that the VCO gain is proportional to its output clock frequency. However, in such a system the gain of the integrating channel must be kept proportional to the output clock frequency of the VCO. Also the ratio of the unity gain frequency and the zero frequency of the PLL must be maintained constant as must their product in order to keep constant the damping factor and in order to scale the natural frequency of the PLL with the output clock frequency of the VCO. One disadvantage of such an approach is that the system operation depends on accurate values of components like resistors and capacitors. Another is that gain of the two channels has to be directly controlled.

SUMMARY OF INVENTION

It is therefore an object of this invention to provide an improved switched capacitance phase locked loop system.

It is a further object of this invention to provide such a switched capacitance phase locked loop system which does not require special control over the gains of the integrating and scaling channel.

It is a further object of this invention to provide such a switched capacitance phase locked loop system which depends on the ratio of values of its components, not their absolute values.

It is a further object of this invention to provide such a switched capacitance phase locked loop system which easily adapts to second and third order phase locked loop implementation.

The invention results from the realization that an improved phase locked loop system which is simpler and more precise, relies on the ratio of its component values as opposed to absolute values, and does not require special control of the gain in the scaling and integrating channels, can be effected by using a switched capacitance integrating technique.

This invention features a switched capacitance phase locked loop (PLL) system including a filter circuit having a scaling channel for scaling the phase error, an integrating channel for integrating the phase error, and a summing device for combining the scaled phase error and the integrated phase error. There is a voltage controlled oscillator (VCO) responsive to the summing device to produce an output. The VCO's gain is proportional to its output clock frequency. The integrating channel includes a switched capacitance integrating circuit for controlling the gain of the integrating channel proportional to the output clock frequency of the VCO and maintaining constant the ratio of, and scaling the product of, the unity gain frequency and the zero frequency of the PLL to keep constant the damping factor and to scale the natural frequency of the PLL with the output clock frequency of the VCO, respectively.

In a preferred embodiment the integrating circuit may include a first amplifier and the scaling channel may include a second amplifier. The switched capacitance integrating circuit may include a first capacitance, a transfer circuit and a first switching device for selectively interconnecting the first capacitance with the first amplifier and the transfer circuit to charge the first capacitance from the first amplifier and transfer the charge in the first capacitance to the transfer circuit. The integrating circuit may include a second capacitance responsive to the transfer circuit for receiving the charge from the first capacitance and providing it to the summing device. The system may further include a switched capacitance filter interconnected between the summing device and the VCO, and the summing device may include a third amplifier. The switched capacitance filter may include a third capacitance, a fourth capacitance and a second switching device for selectively connecting the third capacitance with the third amplifier and the fourth capacitance. The summing device may include a terminal node and the scaling channel may include a switched capacitance filter.

DISCLOSURE OF PREFERRED EMBODIMENT

Figure 3:
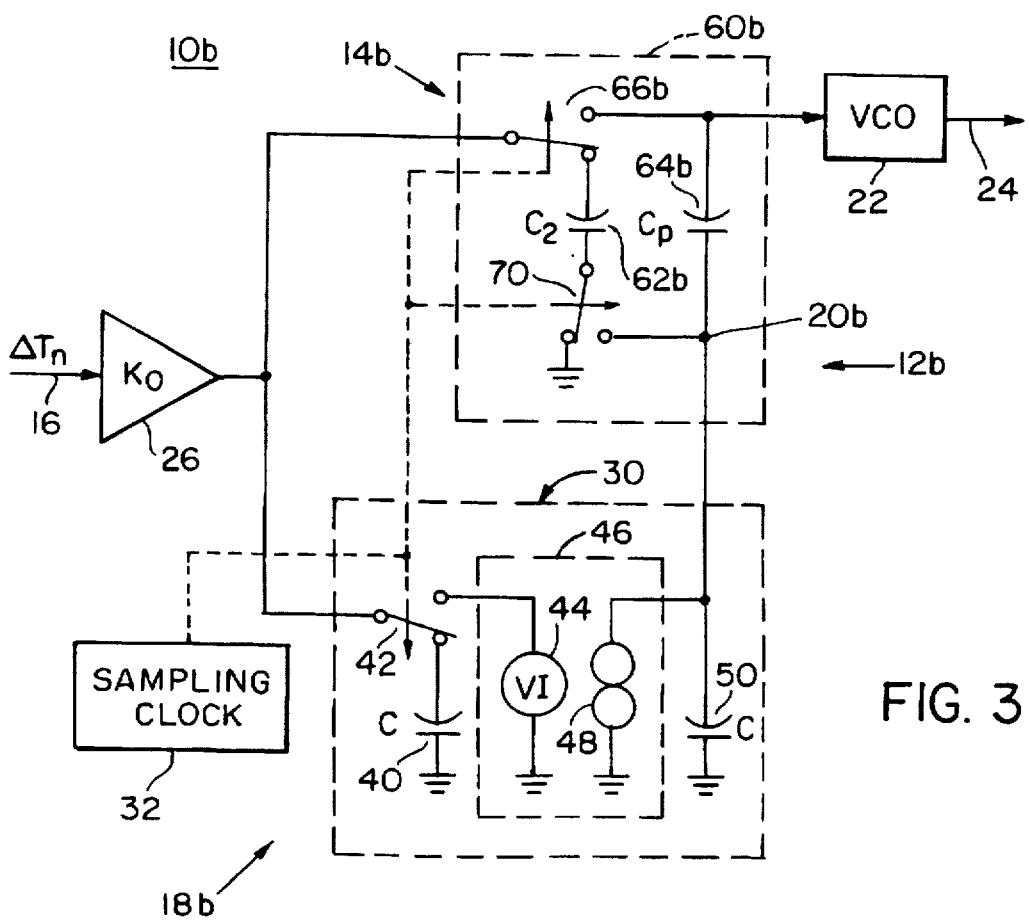
Figure 2:
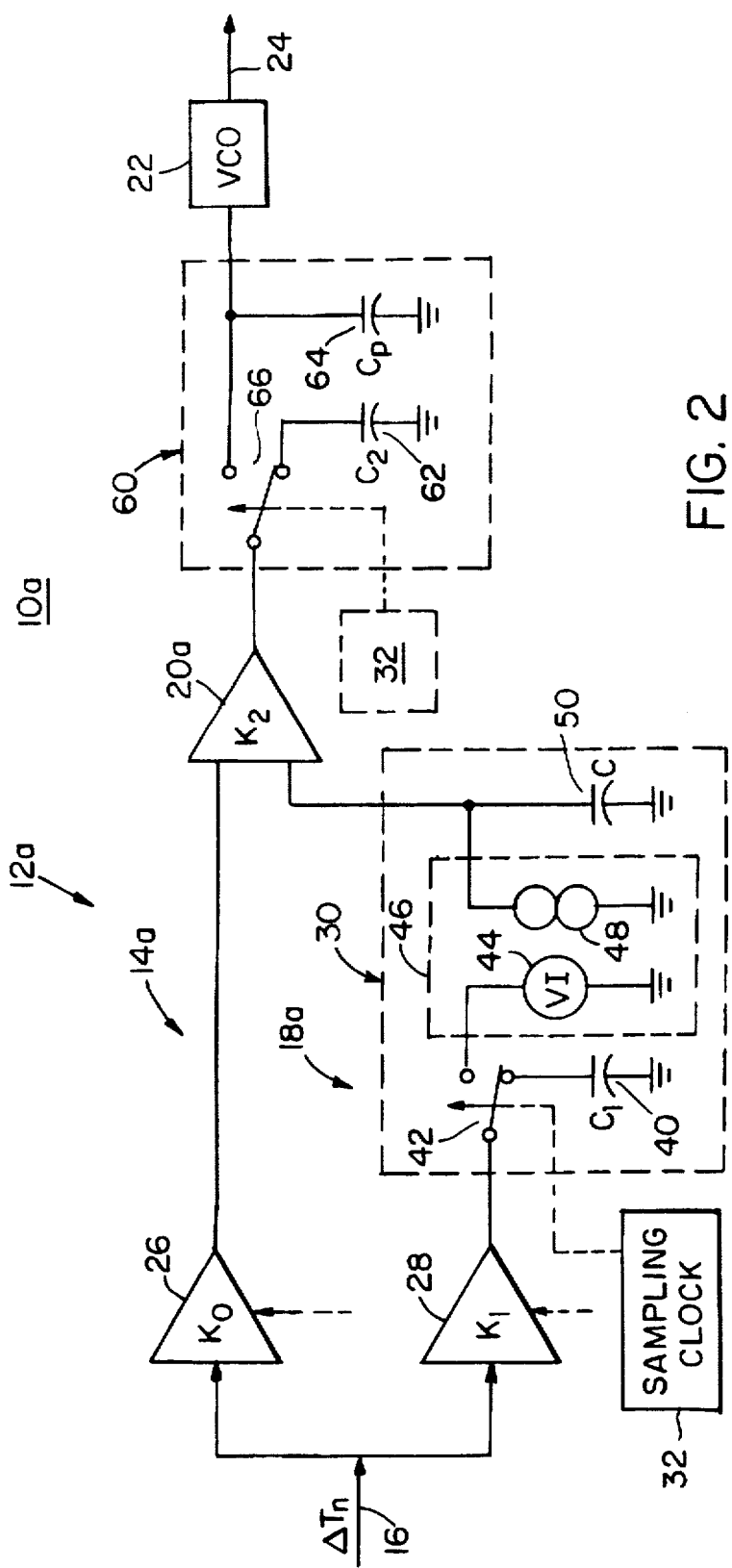

Other objects, features and advantages will occur to those skilled in the art from the following description of a preferred embodiment and the accompanying drawings in which:

FIG. 1 is a schematic block diagram of a switched capacitance phase locked loop system according to this invention;

FIG. 2 is a schematic block diagram similar to FIG. 1 showing the details of the switched capacitance integrating circuit of FIG. 1 as well as the addition of an amplifier and switched capacitance filter for a third order phase locked loop implementation; and FIG. 3 is a schematic block diagram similar to FIG. 2 in which the switched capacitance filter is connected in the scaling channel and a single amplifier is used to drive both channels.

This invention may be accomplished with a switch capacitance phase locked loop which uses two channels, a scaling channel and an integrating channel, whose outputs are combined by a summing device and submitted to a voltage controlled oscillator (VCO) to provide the VCO clock output. In keeping with this invention and constituting an improvement over prior approaches, the integrating channel includes a switched capacitance integrating circuit which is operated by a sampling clock at a rate that is proportional to or may in fact be derived directly from the VCO clock output. This eliminates the need for any control circuitry, as in prior art devices, in order to accommodate the damping factor and to scale the natural frequency of the phase locked loop with the output clock frequency of the VCO. In addition, this invention eliminates the need for resistance components in a scaling channel. Only capacitances are employed in the switched capacitor integrating circuit. This means that the absolute values are no longer determinative of the accuracy of the system, but rather the ratio of the components is. Since the ratio of components can be closely controlled in the fabrication process, the accuracy of these systems is much improved.

There is shown in FIG. 1 a switched capacitance phase locked loop system 10 according to this invention which includes a filter circuit 12 having a scaling channel 14 for scaling the phase error $\Delta T_n$ at input 16 and an integrating channel 18 for integrating the phase error at input 16. There is a summing device 20 for combining the scaled phase error and the integrated phase error from channels 14 and 18. A voltage controlled oscillator 22 responds to the summing device 20 to produce an output VCO clock on output line 24. The gain of the VCO is proportional to the frequency of the VCO clock at output 24. Scaling channel 14 includes simply amplifier 26 having gain $K_0$. Integrating channel 18 also includes an amplifier 28 having gain $K_1$ and a switched capacitance integrating circuit 30. Switched capacitance integrating circuit 30 is operated at a predetermined rate by sampling clock 32, which is proportional to the VCO clock output on line 24 or may in fact be that very output itself. It is one of the advantages of system 10 according to this invention that no control circuit is needed to control the gains of amplifiers 26 and 28. Although it is not necessary, in some cases it may be desirable, and this may be effected through control inputs 34 and 36.

In one implementation, switched capacitance integrating circuit 30, FIG. 2, may include a first capacitance 40 connected to ground at one end and to switching device 42 at the other. Switching device 42 operated by sampling clock 32 alternately charges capacitance 40 from amplifier 28 and discharges it through voltage source 44 in transfer circuit 46. Transfer circuit 46 as shown is implemented with a voltage controlled current source including voltage source 44 and current source 48. The current output from current source 48 charges capacitor 50 so that the charge in capacitor 40 is transferred to capacitor 50. The voltage developed in capacitor 50 is provided as one input to the summing device which in this case is implemented by amplifier 20a.

Switched capacitor phase locked loop system 10a in FIG. 2 also demonstrates the facility of the system to be adapted for third order phase locked loop operation by virtue of switched capacitance filter 60 which includes a first capacitor 62, second capacitor 64, and a switching device 66 also operated by sampling clock 32. Capacitor 62 thus is selectively connected to amplifier 20a for charging and then is connected to capacitor 64 to discharge and provide an input voltage to VCO 22.

In yet another construction, FIG. 3, amplifier 28 has been eliminated and the single amplifier 26 provides an input to both scaling channel 14b and integrating channel 18b. In addition, the summing device has been reduced to a simple junction node 20b and the switched capacitance filter 60b has been moved from a position following summing device 20b on the side toward VCO 22 to its present position before summing device 20b, essentially between it and amplifier 26 in the scaling channel 14b. Also, since the lower end of capacitance 64b is now floating in its connection to summing device 20b, a second switching device 70 is employed to connect the lower end of capacitor 62b selectively either to ground or the lower terminal of capacitor 64b at summing device 20b. Switch 70 is also operated by sampling clock 32 along with switches 42 and 66b. The gain in integrating channel 18b can be controlled as indicated in FIGS. 1 and 2 by direct input to amplifiers 28 as well as amplifier 26. Alternatively, and especially in FIG. 3 where one amplifier 26 is serving both scaling channel 14b and integrating channel 18b, the gain in integrating channel 18b may be controlled by providing a number of capacitances 40 of different values so that different ones can be chosen to effect the different gains desired.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A switched capacitance phase locked loop (PLL) system comprising:

a filter circuit having a scaling channel for scaling a phase error; an integrating channel for integrating the phase error; and a summing device for combining the scaled phase error and the integrated phase error; and a voltage controlled oscillator (VCO) responsive to said summing device to produce an output, said VCO having a gain that is proportional to its output clock frequency;

said integrating channel including a switched capacitance integrating circuit for controlling the gain of said integrating channel proportional to the output clock frequency of said VCO and maintaining constant the ratio of and scaling the product of, a unity gain frequency and a zero frequency of the PLL to keep constant a damping factor and to scale a natural frequency of the PLL with the output clock frequency of the VCO, respectively; wherein said unity gain, zero and natural frequencies and said damping factor are measured at the output of said VCO.

2. The phase locked loop system of claim 1 in which said integrating channel includes a first amplifier.

3. The phase locked loop system of claim 1 in which said scaling channel includes a second amplifier.

4. The phase locked loop system of claim 3 in which said switched capacitance integrating circuit includes a first capacitance, a transfer circuit, and a first switching device for selectively interconnecting said first capacitance with said first amplifier and said transfer circuit to charge said first capacitance from said first amplifier and transfer the charge in said first capacitance to said transfer circuit.

5. The phase locked loop system of claim 4 in which said integrating channel includes a second capacitance responsive to said transfer circuit for receiving the charge from said first capacitance and providing it to said summing device.

6. The phase locked loop system of claim 1 further including a switched capacitance filter interconnected between said summing device and said VCO and said summing device includes a third amplifier.

7. The phase locked loop system of claim 6 in which said switched capacitance filter includes a third capacitance, a fourth capacitance and a second switching device for selectively connecting said third capacitance with said third amplifier and said fourth capacitance.

8. The phase locked loop system of claim 1 in which said summing device includes a terminal node and said scaling channel includes a switched capacitance filter.

* * * * *